United States Patent [19]

Parks et al.

[11] 4,081,794
[45] Mar. 28, 1978

[54] ALLOY JUNCTION ARCHIVAL MEMORY PLANE AND METHODS FOR WRITING DATA THEREON

[75] Inventors: Harold G. Parks, Scotia; Conilee G. Kirkpatrick, Schenectady, both of N.Y.

[73] Assignee: General Electric Company, Schenectady, N.Y.

[21] Appl. No.: 673,080

[22] Filed: Apr. 2, 1976

[51] Int. Cl.² .................. G11C 11/42; G11C 17/06
[52] U.S. Cl. .................................. 365/118; 29/576 B; 29/590; 148/185; 219/121 EM; 219/121 LM; 357/29; 357/31; 357/60; 365/114; 365/103
[58] Field of Search ............... 340/173 LS, 173 CR, 340/173 SP; 357/61, 63, 90, 45; 346/76 L; 360/59; 219/121 L, 121 LM, 121 EB, 121 EM

[56] References Cited

U.S. PATENT DOCUMENTS

| | | |
|---|---|---|
| 3,242,014 | 9/1963 | Takagi et al. ............... 219/121 EM |
| 3,537,920 | 11/1970 | Carpentier ........................ 148/183 |
| 3,648,257 | 3/1972 | Wiese, Jr. et al. ............ 340/173 CR |
| 3,716,844 | 2/1973 | Brodsky ........................ 340/173 LS |
| 3,761,895 | 9/1973 | Ellis et al. ..................... 340/173 LS |
| 3,959,799 | 5/1976 | Gambino et al. ............. 340/173 LS |

*Primary Examiner*—Stuart N. Hecker
*Assistant Examiner*—Donald McElheny
*Attorney, Agent, or Firm*—Geoffrey H. Krauss; Joseph T. Cohen; Jerome C. Squillaro

[57] ABSTRACT

A memory plane for an archival, non-volatile mass storage memory has a planar semiconductor diode with each of a plurality of small P-N junction diodes alloyed into the surface of its fabricated layer responsive to a selectively-actuated scanned energy beam at each location corresponding to a first binary value in a planar array of data sites. Formation of a P-N junction is prevented at each of the remaining sites of the planar data array to provide storage of data having the remaining binary value.

Several alternative methods for formation of the alloy junction surface diodes are disclosed.

21 Claims, 8 Drawing Figures

U.S. Patent  March 28, 1978  4,081,794
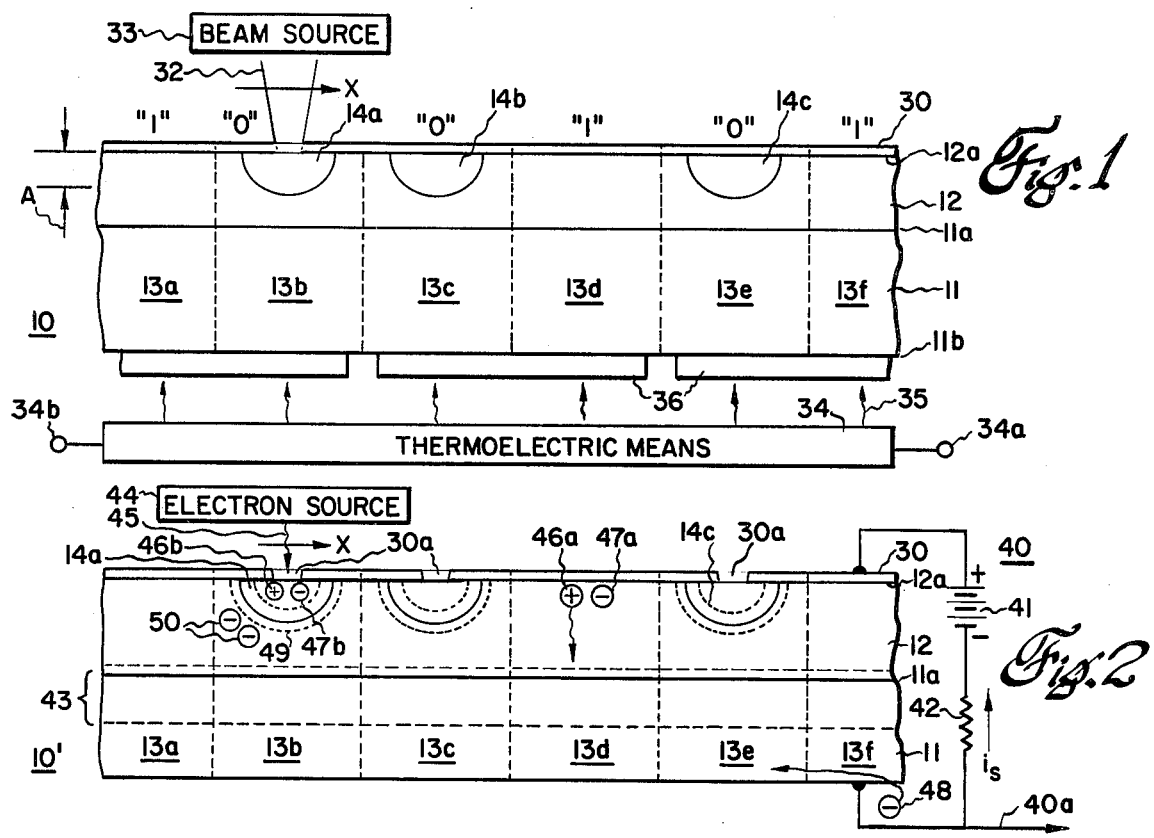
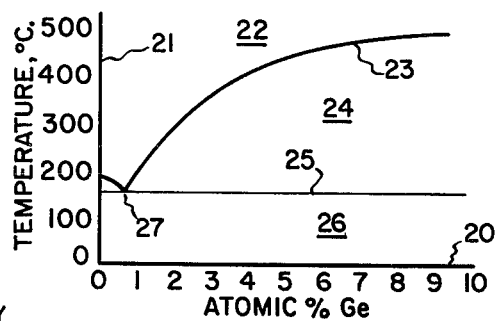
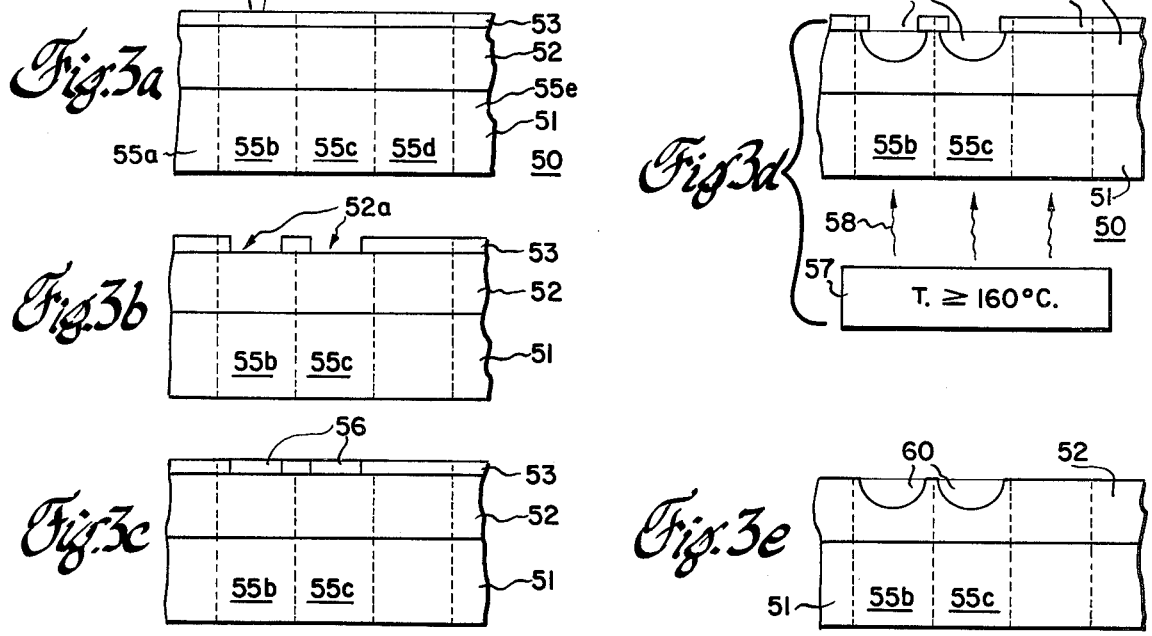

ALLOY JUNCTION ARCHIVAL MEMORY PLANE AND METHODS FOR WRITING DATA THEREON

BACKGROUND OF THE INVENTION

The present invention relates to mass data storage memories and more particularly to a novel alloy junction archival memory plane and methods for writing thereon and reading therefrom binary data.

Modern information-processing applications frequently require the ability to store large quantities of data, usually in a binary format. The storage media must be non-volatile, whereby data is stored without change in content over long periods of time. In many applications, such as Social Security accounting and technological information retrieval systems, the digital information is initially entered into the memory and maintained essentially in an unchanged state for the entire storage interval, once the authenticity and parity of the data written into the memory is confirmed. Consequently, such memories are usually referred to as "read-mostly" memories, i.e. data is initially written, almost never changed in content, and maintained therein with long intervals between writing of additional data with frequent read operations being enabled to repeated retrieve the same stored information.

Archival memories require extremely high data capacity, frequently exceeding one tera-bit ($10^{12}$ bits) per memory device. Entry of such vast amounts of data require the memory to be capable of extremely high writing (input) speeds, while useful reading (output) of the stored information mandates that wide bandwidth be provided. Additionally, the output signals should possess exemplary signal-to-noise ratios (requiring high device gain), so as to produce the required read-data reproducibility.

STATE OF THE ART

One device capable of fulfilling the above-stated requirements is described in U.S. Pat. No. 3,761,895, entitled "Method and Apparatus for Storing and Reading Out Charge in An Insulating Layer", issued Sept. 25, 1973 and assigned to the assignee of the present invention. The memory target described in the aformentioned U.S. Patent requires a four layer structure: a p-type semiconductor substrate; an n-type semiconductor layer grown upon the substrate; a dielectrically insulated layer upon the n-type semiconductor; and a metallized layer deposited upon the top surface of the dielectric layer. Entry of information is by use of an electron beam to write or deposit a quantity of electrical charge into the dielectric layer, when the metallized layer is biased at a first potential with respect to the substrate for storage of data at selected sites therein. The memory is read by changing the bias potential to cause magnitude variation of the current flowing through the p-n junction (which junction is reverse biased) in response to the electron beam being incident upon a charged site. The memory media is completely erased, in nonrecoverable manner, by scanning the electron beam completely across the array of possible data sites with a third bias applied to discharge all storage sites; this technique of erasure, while beneficial in certain applications, also presents the possibility of accidental erasure of at least a portion of the memory plane should the bias switching mechanism malfunction during electron beam scanning.

A memory target which is not capable of having its data patterns modified by charge inducement due to the scanned electron beam (utilized for data reading) is desirable. Additionally, a target configuration which removes the necessity for a plurality of different target bias potentials (and the sources and switching required to implement the same) will not only result in greater memory reliability, but will also reduce the possibility of erroneous data readout.

BRIEF SUMMARY OF THE INVENTION

In accordance with the invention, a memory plane for an archival non-volatile mass data storage memory capable of having its information content modified responsive to an incident heat-producing beam comprises a planar diode having a substrate of a first polarity-type semiconductor material and a layer of the same semiconductor material and of opposite polarity type fabricated upon a first surface of the substrate; and a film of a dopant material, selected to impart impurities of the first polarity-type, deposited upon a surface of the layer furthest from the substrate and at at least several of a plurality of data storage sites defining a data storage array in the plane of the planar diode. Heat-producing means, such as a focussed electron or laser beam, thermoelectric bulk heater and the like, increases the temperature of the planar diode to be greater, in the region of the deposited film, than the eutectic temperature of an alloy of the semiconductor and dopant materials whereby atoms of the dopant material diffuse into the surface of the layer to change its polarity type. The quantity of heat energy is controlled to limit the area in which the semiconductor dopant alloy melt is formed, whereby, upon regrowth of that region, a second diode structure is alloyed into the top planar diode layer.

For high data storage density, the diameter of the alloy junction region is minimized by use of highly focussed electron or laser beams, or by high-resolution photo-masking techniques, for deposition of the impurity material. Resident thermoelectric heating means adjacent to the bottom substrate surface provides a thermal bias to further reduce the required energy from the thermal activating beam during alloy junction formation to prevent excessive damage thereto and to enable greater write-bandwidth.

The data stored in the archival memory plane is read by scanning the surface thereof with a focussed electron beam, which beam induces electron-hole pair formation at or near the surface of the planar diode layer. In regions devoid of an alloy junction p-n surface diode, the excess minority carriers diffuse to the depletion region of the main planar diode to recombine and cause a flow of signal current in an external circuit coupled between the top surface of the planar diode layer and the furthest surface therefrom of the planar diode substrate, thereby producing a first binary value. The signal current magnitude is determined by the energy of the scanning electron beam. In a region containing a p-n alloy junction surface diode, electron-hole pair production occurs within the surface diode region, whereby the excess minority carriers diffuse into adjacent regions of the fabricated layer and undergo recombination essentially prior to their diffusion into the main planar diode depletion region, thereby preventing a flow of signal current in the external circuit and providing a substantially zero output signal magnitude for a remaining binary value.

Each alloy junction is formed by either a photomasking process or by heating of a selected film-layer region by an energy beam (laser or electron), with the heating process being advantageously accelerated by preheating of the planar diode means by resident thermoelectric means.

Accordingly, it is one object of the present invention to provide a novel archival memory plane having surface diodes permanently formed therein for representation of stored data having a first binary value.

It is another object of the present invention to provide a novel archival memory plane in which the surface diodes are of the alloy junction type.

It is still another object of the present invention to provide a novel archival memory plane in which the alloy junction surface diodes are written by beams having minimal energy, to minimize production of structural defects in the semiconductor lattice.

It is a further object of the present invention to provide novel methods for the formation (writing) of such alloy junction regions in a memory plane.

These and other objects of the present invention will become clear to those skilled in the art upon reading the following detailed description and the drawings.

BRIEF DESCRIPTION OF THE DRAWINGS

FIG. 1 is a side view of the interior of a preferred embodiment of an archival memory plane in accordance with the principles of the present invention and illustrating one preferred method for the writing of alloy junction surface diodes therein;

FIG. 1a is a portion of the phase diagram, including the eutectic point, of one referred dopant-semiconductor alloy in terms of the fabricated layer temperature and the atomic concentration, and is useful in understanding the principles of the present invention;

FIG. 2 is a side view of the interior of the memory plane of FIG. 1, illustrating the memory read operation; and FIG. 3a–3e are a sequence of side views illustrating another preferred method for writing the formation of alloy junction surface diodes in accordance with a predetermined sequence of binary data values.

DETAILED DESCRIPTION OF THE INVENTION

Referring now to FIGS. 1 and 1a, an archival memory plane 10 has a substrate 11 of semiconductor material of a first polarity-type upon which is fabricated a semiconductor layer 12 of the same semiconductor material but of opposite polarity-type. Layer 12 is n-type germanium gas-diffused upon surface 11a of substrate 11 in a preferred embodiment having p-type germanium substrate 11. A two-dimensional array of possible data sites 13a, . . . , 13z is assigned to the planar diode. For purposes of simplicity, a portion of only one row (or column) of the storage site array is illustrated in FIG. 1, with sequential data sites 13a–13f being shown. It should be understood that the planar array may extend both leftwardly and rightwardly, and into and out of the plane of the drawing, with respect to the portion shown in FIG. 1, to a degree as required for storage of the desired magnitude of data bits. Each of sites 13a–13f will contain a single bit of binary information, written into and read from target 10 by the processes more fully described hereinbelow.

Each of a plurality of regions 14 are alloyed into layer 12 to a depth A beneath the top surface 12a thereof. Each region 14 contains a concentration of dopants of the same polarity-type as substrate 11 (and, therefore, of opposite polarity-type from layer 12) and forms a small P-N junction diode in cooperation with the underlying portion of layer 12. Advantageously, an indium dopant is utilized to form each of regions 14 as a p-type semiconductor.

A phase diagram (FIG. 1a) for indium and germanium, after Wert and Thomson, *Physics and Solids,* Page 82 (1964), has its abscissa 20 scaled in increasing atomic percent of germanium and, hence, decreasing percent (from 100%) of indium. Ordinate 21 is scaled for increasing alloy temperature (degrees C). As known, a mixture of indium and germanium may be heated to some temperature in region 22 at which both components (indium and germanium) are miscible liquids; reduction of the amount of heat energy contained in the mixture causes its temperature to drop, whereby the mixture crosses phase transition line 23 to generally yield a composition, in region 24, having a majority of its germanium in the solid state, with the remainder of its germanium "floating", in the liquid indium. Further reduction of heat energy in the composition causes transition of phase line 25, below which line both indium and germanium exist in region 26, as separate and distinct solid crystals co-existent in a single metallic substance. Advantageously, indium-germanium compounds have a eutectic point 27 at which the germanium will recrystallize upon freezing whereby a region of indium-doped germanium is created with indium atoms generally substitutionally positioned in the germanium lattice to create electrically active centers. Eutectic point 27 is known to be situated at approximately 156° Centigrade; the resulting alloy consists of approximately 0.6% germanium and 99.4% indium.

In a first preferred embodiment, a film 30 of indium is deposited, as by sputtering and the like process, upon top surface 12a of layer 12. A beam 32, of characteristics suitable to heat film 30 and an underlying portion of layer 12, emanates from a source 33, such as an electron gun, laser or the like, and is focussed and scanned by means contained in source 33 to be sequentially directed essentially at the center of each data storage site 13a–13f. Beam 32 is modulated to impinge on target plane 10 to heat film 30 and underlying region 14 to a temperature sufficiently high to pass the indium and germanium through eutectic point 27 (FIG. 1a). The beam is removed and/or modulated to the "off" condition to allow the mixture to cool, whereby a p-type germanium alloy is grown over at least a portion of each region at which a data bit having a first value, e.g., binary zero, is to be written. Beam 32 is modulated to the "off" condition when scanned across data sites at which information of the remaining binary value, e.g. a binary one, is to be written. Thus, for illustrated data sites 13a–13f having a binary data pattern 100101, beam 32 is modulated to the "off" condition, and does not heat film 30 and layer 12, as the beam is swept in the X direction to be initially positioned at a first storage site 13a; an indium germanium mixture is not formed and a change in the doping level of layer 2 is not effected.

Beam 32 is scanned in the direction of arrow X to next impinge upon film 30 essentially at the center of a second data site 13b, at which site a single binary zero bit of information is to be stored. The beam is modulated to the "on" condition to heat film 30 and layer 12 to a temperature in excess of the eutectic temperature, i.e. approximately 156° C, and form the desired alloy melt. The beam is modulated to the "off" condition to allow the heat energy to dissipate, whereby the local temperature decreases and the germanium grows out of the alloy mixture. Regrown region 14a, after passage through eutectic point 27, has the same lattice structure as the "parent" n-type layer 12, but with a high concentration of indium impurities, whereby the region is a p-type semiconductor forming a p-n diode cathode in layer 12.

Further sequential scanning and modulation of the beam produces respective alloy regions 14b and 14c at data sites 13c and 13e, respectively, with an absence of alloy regions at each of the binary "one" data sites 13d and 13f, respectively.

Alloyed regions 14 (or the lack thereof, such as at sites 13a, 13d and 13f) permanently store each data value in its assigned data site of the planar diode, whereby the data cannot be destroyed as long as target plane 10 remains in tact. It should be understood that, while a data site previously having a binary one value (and, therefore, being devoid of an alloy junction region 14) may subsequently be modified to have a binary zero value written therein by formation of an alloy junction region, the data sites previously alloyed cannot subsequently be "erased" by modification to an unalloyed (binary one value) site. Thus, while additional data may be written into previously unused portions of the memory target, and previously written data may be modified by the addition of a binary zero value at a site previously recorded as a binary one bit, the write process occurs in a single direction. The target plane of the present invention will normally have a major portion of the data site array written in a single scan of beam 32 and will contain large quantities of permanent data, which can be repeatedly accessed from target 10 (as described hereinbelow) that is, will be a "read-mostly" memory, with other memory devices providing for temporary storage of variable data trains.

Impingement of the beam 32 upon layer 12 causes damage of the latter to an extent determined by the time during which the beam 32 dwells at a particular data site 13. To reduce the write-dwell time, the energy content of beam 32 is reduced, while other means are utilized to preheat (or thermally bias) target plane 10 to a temperature below the alloy eutectic temperature (being 156° C for the indium-germanium alloy illustrated). As the eutectic process is a threshold effect, the additional energy imparted to film 30 and layer 12 by beam 32 need only raise the temperature therein to slightly in excess of the eutectic temperature; removal of the beam allows the mixture to cool through the eutectic point to the bias temperature and facilitates alloy production. This thermal-bias technique is advantageously facilitated by means of thermoelectric means 34, such as a resistance heater or the like, positioned below and spaced from a bottom substrate surface 11b, whereby quanta 35 of heat energy radiate into and preheat target plane 10 responsive thermoelectric means 34 receiving a flow of electric current at its terminals 34a, 34b. Alternatively, a plurality of films 36, formed of a suitable resistance material, may be deposited upon bottom substrate surface 11b, whereby heat energy is conducted into at least a selected portion of target plane 10 from each associated one of deposited resistance elements 36 responsive to a flow of current therethrough; the resistance, spacing, area and current flow through each of elements 36 is adjusted to raise the temperature in each portion, or all, of layer 12 to the selected bias value. It should be understood that, while the preferred embodiment presently being described utilizes indium dopant in germanium semiconductor, other semiconductor materials, such as silicon and the like, can be utilized for the planar diode and many different dopant elements, such as aluminum and the like, can similarly be utilized in place of indium. Further, the dopant polarities of both substrate 11-region 14 and layer 12 may be reversed; the particular process for fabricating layer 12 upon substrate 11 may be any suitable process, such as ion implantation, epitaxial growth or the like, without departing from the scope of the present invention. The indium-germanium system is particularly advantageous in that its eutectic temperature is sufficiently low to allow rapid beam heating to yield a high writing speed, as opposed to other possible systems having relatively high eutectic temperatures, such as aluminum-silicon at approximately 577° C and antimony-silicon at about 630° C, although any known eutectic alloy of the column III-V dopants with germanium or silicon can be utilized.

Further, germanium advantageously possesses a thermal diffusivity of only about one-third that of silicon, facilitating increased local temperature in the small (0.1–1.0 micron) regions in which the alloy-junction will be formed responsive to identical beam energies, to further increase writing speed.

Referring now to FIG. 2, wherein like elements have like reference designations, the written target plane 10' is coupled to an external bias circuit 40, comprised of a source 41 of electrical potential in electrical series connection with an electrical load 42. Source 41 provides a positive potential at film 30 with respect to substrate 11 to reverse bias the junction at surface 11a between the n-type layer 12 and p-type substrate 11 to create a depletion region 43 thereabout. A target plane output connection 40a provided from the junction between load 42 and substrate 11.

In operation, a source 44 generates a finely focussed beam 45 of electrons. Electron source 44 may be identical with beam source 33 (FIG. 1) if the writing process utilizes an electron beam 32 for heating purposes, rather than a beam of laser luminence or the like. Beam 45 is scanned across the surface of the target site array by suitable electrostatic or electromagnetic means (not shown for the purposes of simplicity) which scanning means form a part of source 44. Beam 45 is sequentially positioned at essentially the center of each data site 13a–13f to cause the beam electrons, which are accelerated with a potential of the order of 10 kilovolts, to be transmitted through film 30 and enter into the semiconductor material thereunder. Entry of the accelerated electrons into the semiconductor material generates a local excess of pairs of holes 46 and electrons 47.

Scanning of electron beam 45 to a data site devoid of an alloy junction region 14, such as data site 13d, causes a plurality of pairs of holes 46a and electrons 47a to be formed slightly below top surface 12a. The minority carriers (holes 46a) diffuse towards the main diode depletion region 43, which diffusion is advantageously facilitated by a tapering doping gradient n layer 12, whereby the magnitude of dopant atoms per cubic centimeter decreases from layer top surface 12a toward junction 11a. A large fraction of holes 46a diffuse to depletion region 43 to decrease the depletion region capacitance. Electron-hole recombination causes a replenishment flow of electrons 48 from the negative terminal of potential source 41 into substrate 11 to produce a signal current $i_s$ through load 42. A flow of signal current $i_s$ causes a signal voltage to form across load 42, and appear at memory output 40a for subsequent data processing external to target plane 10'. As each electron-hole pair only requires about 3.5eV. of energy for its creation, a scanning beam accelerated to about 10keV. will produce at least 1000 holes actually recombining in the vicinity of depletion region 43, whereby a current amplification factor of greater than 1000 is achieved.

When electron beam 45 impinges upon an alloyed region, such as data site 13b, a relatively greater number of pairs of holes 46b and electrons 47b are created as a greater percentage of beam energy is transmitted through to alloy junction region 14a, due to the removal of a volume 30a of indium film 30 during the alloy-junction formation process. The excess minority carriers, being electrons 47b in a p-type semiconductor region 14a, diffuse through alloy-junction depletion region 49. The diffused electrons 50 "line" the portion of the depletion region formed furthest into layer 12. As there is no diffusion of holes 46b through alloy-junction diode depletion region 49 to main depletion region 43, a minimal flow of signal current $i_s$ is induced to flow through load 42, with a relatively low magnitude output signal being formed at target output 40a, indicative of a binary 0 (positive logic) data value.

Thus, as electron beam 45 is scanned in the direction of arrow X rightwardly across the surface of film 30, excess minority carriers are induced in first region 13a and diffuse to depletion region 43 to provide a binary one signal at output 40a; continued beam scanning in the X direction causes production of a local excess of minority carriers 46b sequentially in each of alloy-junction regions 14a and 14b, respectively, of respective data sites 13b and 13c, whereby minimal diffusion of holes to the main depletion region 43 occurs to produce binary zero signal magnitude at output 40a. Similarly, continued scanning of the beam in the X direction to data sites 13d, 13e, and 13f, respectively, produce respective binary one, binary zero and binary one data values therefor.

Suitable control of the deposition of dopant film 30 is achieved by proper selection of the temperature, atmospheric content, crystal orientation and choice of flux during the fabrication process. The use of a flux containing a small percentage of zince is particularly desirable to obtain uniform wetting with indium layer fabrication, particularly the use of zinc chloride which tends to dissolve indium. The use of a zinc chloride agent is preferred if the target is to be written by an electron beam, as use of a hydrogen reducing temperature will alternate the energy of the electron beam.

As previously stated, other dopant-semiconductor eutectic systems can be utilized. A planar diode having a p-type silicon substrate and a 1.6 micron thick layer of n-type silicon was sputter coated with 1000 A of aluminum. The eutectic temperature of 577° C was exceeded by the heat induced with pulsed laser luminence having a peak power of about 2 KW. Output voltages having a swing of about 1.5 volts, sufficient to switch most commonly available families of digital logic, are easily obtained by video preamplification of the signal at output 40a.

Referring now to FIGS. 3a-3e, a second preferred method for the formation of the alloy-junction region utilizes a photomasking technique. A planar diode 50 having a substrate 51 of a first polarity-type semiconductor, such as p-type germanium, has a layer 52 of the same semiconductor material but of opposite polarity-type, such as n-type germanium, fabricated thereon by any desired process. A layer 53 of a photoresistive material capable of being exposed by an electron beam 54 is deposited upon the open surface of semiconductor layer 52. A two-dimension array of possible data sites 55a, ... 55z is defined on the resist-masked planar diode and electron beam 54 is sequentially scanned across the array, herein illustrated as consisting of adjacent data storage sites 55a–55b. The beam is modulated between its "on" and "off" conditions to expose resist layer 53 at those sites, such as sites 55b and 55c, at which an alloy-junction diode is to be formed. Thus, as beam 54 is swept in the Y direction, the beam is modulated to its "off" condition to prevent exposure of resist layer 53 above data storage site 55a; is modulated to its "on" condition when the beam is essentially centered at the midpoint of each of data storage sites 55b and 55c, respectively; and is again modulated to the "off" condition when scanned across data sites 55d and 55e, respectively.

The exposed resist layer 53 is then developed (FIG. 3b), and the exposed resist portions, (herein illustrated as being above data sites 55b and 55c) are removed to expose top surface 52a of fabricated semiconductor layer 52.

A film 56 of a dopant material, such as indium and the like, is fabricated (FIG. 3c) upon semiconductor fabricated layer 52 at those portions thereof which are not coated by resist layer 53. Advantageously, the dopant film may be vapor deposited.

The target plane 50 (FIG. 3d) is heated, as by heating means 57, to facilitate planar target 50 receiving a sufficient number of heat quanta 58 to raise the internal temperature of at least semiconductor layer 52 and film 56 to be greater than the eutectic temperature, being approximately 160° C for the indium-germanium alloy herein illustrated. Each area of dopant film 56 forms one of alloy junction diodes 60 within its associated data storage site 55b, 55c, respectively, at which a binary 0 data value is to be stored.

The remaining portions of photoresist layer 53 are removed (FIG. 3e) by an appropriate process, such as mask lift-off or the like, to provide a planar diode substrate 51 and fabricated layer 52 in which an alloy junction region 60 has been grown at each data site having the first binary balue ("0") to be stored and having the remaining data sites devoid of alloy junction regions and hence having the remaining binary data value ("1") assigned thereto.

The mask-fabricated written planar diode is sequentially scanned by an electron beam to produce a signal across the load of its bias circuit (not shown for purposes of simplicity) in the same fashion as hereinabove described for the beam-written planar target 10 of FIGS. 1 and 2.

An overfilm 30 (FIG. 1) may be deposited upon the free surface of layer 52 to facilitate more rapid relaxation of the charges induced in each alloy junction region to increase the reading speed of the planar target of either embodiment, although the over film is not required for proper operation of the present invention at relatively slow reading speeds.

The mask-fabrication method is particularly advantageous in the creation of a large number of mass data storage memories having the same data content, whereby a single mask may be used to expose each target plane 50 with highly reproducible results. Additionally, a mask-fabricated target plane devoid of metallic film 30 may utilize a reading electron beam 45 (FIG. 2) having a lower energy while providing the same signal gain, as an intervening metallic layer need not be present to reduce the energy of the scanning electrons.

While the present invention has been described with respect to several preferred embodiments thereof, many variations and modifications will now occur to those skilled in the art. In particular, substitution of other semiconductors for germanium and other dopant elements for indium. As previously mentioned, the designation of p-type and n-type regions, layers and substrates may be interchanged in a novel device of the present disclosure. Thus, we do not intend to be limited by the present disclosure, but only by the appended claims.

What we claim as new and desire to secure by Letters Patent of the United States is:

1. A memory plane for a non-volatile mass data storage memory capable of having its information content written in accordance with a preselected data pattern and responsive only to inducement of an elevated temperature therein at least partially by a heat-producing beam, said memory plane comprising:
   a planar semiconductor diode structure comprising a substrate of a semiconductor material of a first polarity-type, said substrate having a first surface; and a layer of the same semiconductor material and of an opposite polarity-type, said layer being fabricated upon said first surface and having a top surface, opposite said first surface, with an array of a first plurality of possible data sites defined thereon; and
   solid means fabricated only upon said top surface for eutectically forming an alloyed region of predetermined electrical characteristics in said layer of said planar diode structure at each of a second plurality of said data sites responsive to inducement of said elevated temperature thereat, said second plurality being less than said first plurality of said data sites, each said region permanently storing a bit of data thereat having a first binary value readable as a relatively small change in a current through the junction between said substrate and said layer, due to local recombination in said region, when said region is illuminated by an electron beam;
   all remaining sites of said plurality of possible data sites being devoid of said regions to store a bit of data thereat having a remaining binary value readable as a relatively large change in said current through said junction when said region is illuminated by said electron beam.

2. A memory plane as set forth in claim 1, wherein said means comprises a film of a dopant material deposited upon said top surface of said planar diode layer at at least the locations of said second plurality of data sites, said dopant material being selected to eutectically alloy with said semiconductor material to change the polarity of the semiconductor material of said layer to said first polarity-type.

3. A memory plane as set forth in claim 2, wherein said dopant and semiconductor materials are coordinately selected to have a eutectic temperature less than said elevated temperature, whereby said dopant and semiconductor materials form an alloy melt during selective heating of each said region and regrow an alloy junction therein upon cooling.

4. A memory plane as set forth in claim 3, wherein said semiconductor material is selected from the group consisting of germanium and silicon.

5. A memory plane as set forth in claim 3, wherein both said dopant and semiconductor materials are jointly selected from the group consisting of: indium and germanium, aluminum and silicon, and antimony and silicon.

6. A memory plane as set forth in claim 2, wherein said dopant material is electrically conductive; and at least a portion of said dopant film remains upon said top surface between each region and an adjacent portion of said layer after formation of the region to minimize a lateral diffusion of minority carriers to adjacent data sites.

7. A memory plane as set forth in claim 1, wherein said layer has a doping profile having a greatest concentration of dopants adjacent to said top surface and decreasing towards said first surface.

8. In combination, a memory plane as set forth in claim 1; and second means for selectively inducing said elevated temperature in said planar diode structure and said means to produce a eutectically alloyed region at each of said second plurality of said data sites.

9. A combination as set forth in claim 8, wherein said second means comprises means for providing and focussing a beam of electrons upon said first means, said beam having an energy sufficient to elevate the temperature of said solid means and at least the underlying portion of said semiconductor layer to beyond the eutectic temperature of an alloy of the materials thereof to selectively form each said region upon cooling thereof.

10. A combination as set forth in claim 8, wherein said second means comprises means for providing and focussing a beam of photons upon said first means, said beam having an energy sufficient to elevate the temperature of said solid means and at least the underlying portion of said semiconductor layer to beyond the eutectic temperature of an alloy of the material thereof to selectively form each said region upon cooling thereof.

11. A combination as set forth in claim 10, wherein said photon providing and focussing means is a laser device.

12. A combination as set forth in claim 8, further comprising third means for preheating said planar diode structure to a bias temperature less than said eutectic temperature.

13. In combination, a memory plane as set forth in claim 1; fourth means for reverse biasing said substrate and layer of the planar diode structure to form a depletion region therein only during reading of the data values from said memory plane; and fifth means for scanning a finely focussed beam of electrons across at least a portion of said top surface of said planar diode structure to cause a first magnitude of current to flow between said planar diode structure and said fourth means responsive to said electron beam impinging upon each of said eutectic alloy regions and another magnitude of current is caused to flow therebetween responsive to said electron beam impinging upon a data site devoid of a eutectic alloy region.

14. A method for storing a preselected data pattern in non-volatile fashion, said method comprising the steps of:
   providing a planar diode structure having a substrate and a layer thereon of opposite polarity-type semiconductor material, said layer having a top surface with an array of a first plurality of possible data sites defined thereon;

fabricating a solid film of a dopant material directly upon said top surface;

selectively locally heating said film and at least a part of the layer of said planar diode structure at each of a second plurality of said data sites to form in said semiconductor layer a region thereat of a eutectic alloy of said semiconductor and dopant materials, each said region having predetermined electrical characteristics to store a bit of data having a first binary value, said second plurality being less than said first plurality of said data sites; and preventing the localized heating of said film and said planar diode structure at all of the remaining sites of said first plurality of possible data sites to store thereat a bit of data having a remaining binary value.

15. A method as set forth in claim 14, wherein said heating step comprises the steps of: focussing a beam of heat producing photons upon said top surface; scanning said beam to each of said first plurality of possible data sites; and modulating said beam in accordance with said preselected data pattern to impinge upon said film and said planar diode structure only at data sites in which said first binary value is to be stored and to prevent impingement upon the remaining sites of said plurality of said possible data sites.

16. A method as set forth in claim 14, further comprising the step of preheating said planar diode structure to a temperature less than the eutectic temperature of an alloy formed of the materials of said film and said planar diode structure to reduce the energy of said beam required to locally heat said film and said planar diode structure.

17. A method as set forth in claim 14, wherein said fabricating step comprises the substeps of wetting said top surface with a wetting agent; and depositing said film upon the wetted top surface.

18. A method for storing a preselected data pattern in non-volatile fashion, said method comprising the steps of:

providing a planar diode structure formed of a substrate and a layer of opposite polarity-type semiconductor material and having a top surface with an array of a first plurality of possible data sites defined thereon;

forming a pattern of resist material upon said top surface in accordance with said preselected data pattern;

depositing a film of a dopant material upon at least that portion of said top surface devoid of said resist material;

heating said film and at least a part of said layer of said planar diode structure to a temperature in excess of the eutectic temperature of said semiconductor and dopant materials; and cooling said planar diode structure to form an alloyed region of predetermined electrical characteristics at each of a second plurality of said data sites to store a bit of data thereat having a first binary value, said second plurality being less than said first plurality of data sites, all remaining sites of said first plurality of possible data sites being devoid of said regions to store a bit of data thereat having a reamining binary value.

19. A method as set forth in claim 18, further comprising the step of removing said resist material after said cooling step.

20. A method as set forth in claim 18, wherein said pattern forming step further comprises the steps of: coating said top surface with a film of a resist material exposible responsive to impingement of electrons thereon; focussing a beam of electrons upon said top surface; scanning said beam to each possible data site of said array; and modulating said electron beam in accordance with said preselected data pattern to a first condition to impinge upon each of said first plurality of data sites, at which a bit of data having a first binary value is to be stored, to expose said resist material and to a second condition to prevent exposure of said resist material at all remaining data sites to store said remaining binary value thereat.

21. A method as set forth in claim 18, further comprising the step of wetting said top surface with a wetting agent for said dopant material prior to said depositing step.

* * * * *